United States Patent
Nakano et al.

(10) Patent No.: US 8,829,762 B2
(45) Date of Patent: Sep. 9, 2014

(54) SURFACE ACOUSTIC WAVE DEVICE

(75) Inventors: Masahiro Nakano, Hong Kong (CN); Hirohiko Kamimura, Hong Kong (CN); Atsushi Iijima, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 325 days.

(21) Appl. No.: 13/064,490

(22) Filed: Mar. 29, 2011

(65) Prior Publication Data

US 2011/0241480 A1  Oct. 6, 2011

(30) Foreign Application Priority Data

Mar. 30, 2010 (JP) ................. 2010-076633

(51) Int. Cl.
*H01L 41/047* (2006.01)
*H03H 9/02* (2006.01)

(52) U.S. Cl.
CPC ....... *H03H 9/02149* (2013.01); *H03H 9/02944* (2013.01); *H03H 9/02015* (2013.01)
USPC ............... 310/313 B; 310/313 R; 310/313 A; 310/313 C

(58) Field of Classification Search
CPC ....................... H03H 9/14505; H03H 9/14547
USPC ....... 310/313 B, 313 C, 313 A, 313 D, 313 R
See application file for complete search history.

(56) References Cited

U.S. PATENT DOCUMENTS

| | | | |
|---|---|---|---|
| 6,407,486 B1 * | 6/2002 | Kimura et al. | 310/364 |
| 6,657,366 B2 * | 12/2003 | Watanabe et al. | 310/364 |
| 6,826,815 B2 * | 12/2004 | Nakagawa et al. | 29/25.35 |
| 7,554,428 B2 * | 6/2009 | Yamamoto et al. | 333/193 |
| 2001/0054305 A1 * | 12/2001 | Banda et al. | 73/24.01 |
| 2003/0067369 A1 * | 4/2003 | Nakano et al. | 333/193 |
| 2005/0179340 A1 * | 8/2005 | Yoshioka et al. | 310/312 |

FOREIGN PATENT DOCUMENTS

| | | |
|---|---|---|
| JP | 2001-94383 | 4/2001 |
| JP | 2002-135075 | 5/2002 |
| JP | 2003-101372 | * 4/2003 |
| JP | 2006-5434 | 1/2006 |
| JP | 2003-101372 | 4/2008 |
| WO | 03/058813 | 7/2003 |

OTHER PUBLICATIONS

Provided English Translation of JP 2002-135075, Watanabe Masanobu.*

(Continued)

*Primary Examiner* — Derek Rosenau
*Assistant Examiner* — Bryan Gordon
(74) *Attorney, Agent, or Firm* — Nixon & Vanderhye PC

(57) ABSTRACT

A surface acoustic wave device according to the present invention includes a piezoelectric monocrystal substrate 10, and an interdigital electrode 20 configured of a base electrode layer 21 formed on the piezoelectric monocrystal substrate, the base electrode layer 21 being made of a conductive material, and an aluminum-containing main electrode layer 22 formed on the base electrode layer by epitaxial growth. The electrode 20 has an upper layer 23 formed on the main electrode layer 22, and the upper layer 23 is made of a conductive material that is different from materials for the main electrode layer and the base electrode layer and has a larger specific gravity than aluminum.

11 Claims, 14 Drawing Sheets

(56) References Cited

OTHER PUBLICATIONS

Provided English Translation of JP 2001-094383, Takagi Toshiyuki.*
Provided English Translation of JP 2006-005434, Kono Hideyasu.*
Provided English Translation of JP 2003-101372, Shibaura.*
Office Action issued on Jul. 9, 2013 in corresponding Japanese Application No. 2010-076633 (with partial translation).
Appeal Decision to Grant a Patent issued on Aug. 6, 2013 in corresponding Japanese Application No. 2010-076633 (with concise explanation provided in accompanying IDS in Section 6).

* cited by examiner

Fig.14A
0°LiNbO3          39°LiTaO3
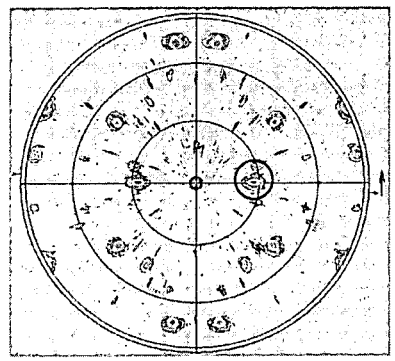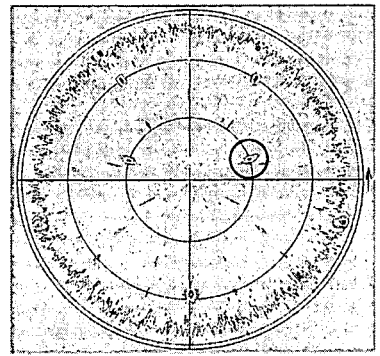
Fig.14B
| PIEZOELECTRIC SUBSTRATE | HALF-VALUE WIDTH [°] |
|---|---|
| 39° LiTaO3 | 0.73 |
| 0° LiNbO3 | 1.82 |

SURFACE ACOUSTIC WAVE DEVICE

This application claims priority to Japanese Application No. 2010-076633 filed 30 Mar. 2010, the entire contents of which is hereby incorporated by reference.

TECHNICAL FIELD

The present invention relates to a surface acoustic wave device, in particular to a surface acoustic wave device having an electrode including an aluminum-containing layer formed on piezoelectric substrate by epitaxial growth.

BACKGROUND ART

Examples of an electronic device that can be used as a frequency filter or a resonator include a surface acoustic wave (SAW) device. The surface acoustic wave device is configured by forming an interdigital electrode formed of a metal film that excites a surface acoustic wave, such as an aluminum film, on a surface of a monocrystal substrate having piezoelectric properties, such as a lithium tantalate ($LiTaO_3$) or a lithium niobate ($LiNbO_3$) substrate.

Because the surface acoustic wave device can be miniaturized, with further reduction of mobile communication equipment including portable telephones in size in recent years, the surface acoustic wave device has been used as a duplexer for taking an electric signal in a certain frequency band from a received wave or a transmitted wave in the mobile communication equipment.

When used as the duplexer equipped in the portable telephone, the surface acoustic wave device necessarily inputs/outputs and processes high frequencies, requiring a high power durability. To satisfy this requirement, Patent document 1 discloses a technique of improving the power durability of the surface acoustic wave device. Specifically, Patent document 1 discloses that a piezoelectric monocrystal substrate having a cut angle in a specific range is adopted, a titanium nitride layer is laminated on the substrate and then, an aluminum layer that serves as an electrode layer is further formed thereon by epitaxial growth. This can form an electrode having no grain boundary, thereby improving the power durability.

[Patent document 1] Unexamined Patent Publication No. 2003-101372

However, the above-mentioned surface acoustic wave device disclosed in Patent document 1 has a problem that the cut angle of the piezoelectric monocrystal substrate used in the surface acoustic wave device is limited. That is, the crystal structure of the surface of the piezoelectric monocrystal substrate needs to match that of the titanium nitride layer and thus, the piezoelectric monocrystal substrate having a specific cut angle must be used. When the piezoelectric monocrystal substrate having the specific cut angle is not used, the power durability of the surface acoustic wave device disadvantageously lowers, resulting in quality deterioration.

SUMMARY OF THE INVENTION

Therefore, an object of the present invention is to improve the power durability while suppressing the limitation in manufacturing of the surface acoustic wave device as the above-mentioned problem.

To attain the object, a surface acoustic wave device from first aspect of the present invention includes a piezoelectric monocrystal substrate, and an interdigital electrode configured of a base electrode layer formed of the piezoelectric monocrystal substrate, the base electrode layer being made of a conductive material, and an aluminum-containing main electrode layer formed on the base electrode layer by epitaxial growth.

The electrode has an upper layer formed on the main electrode layer, the upper layer being made of a conductive material that is different from materials for the main electrode layer and the base electrode layer and has a larger specific gravity than aluminum.

A manufacturing method of a surface acoustic wave device from another aspect of the present invention includes forming a base electrode layer made of a conductive material on a piezoelectric monocrystal substrate, forming an aluminum-containing main electrode layer on the base electrode layer by epitaxial growth, forming an upper layer on the main electrode layer, the upper layer being made of a conductive material that is different from materials for the main electrode layer and the base electrode layer and forming an interdigital electrode configured of the base electrode layer, the main electrode layer and the upper layer on the piezoelectric monocrystal substrate.

According to the present invention, with the above-mentioned configuration, a high-quality surface acoustic wave device having a high power durability can be manufactured while suppressing the limitation in manufacturing.

BRIEF DESCRIPTION OF THE DRAWINGS

FIG. 14A is a pole figure showing characteristics of the surface acoustic wave device according to the present invention; and FIG. 14B shows half-value widths representing the characteristics of the surface acoustic wave device according to the present invention.

EXEMPLARY EMBODIMENTS

<First Exemplary Embodiment>

Figure 1:
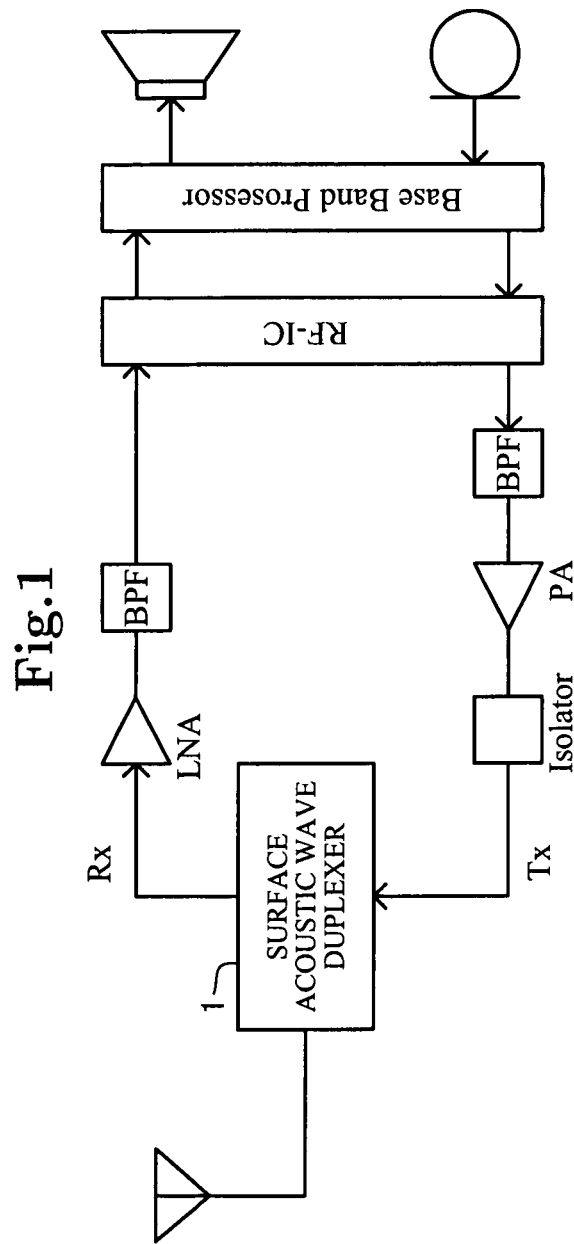
FIG. 1 is a block diagram schematically showing an internal structure of a portable telephone.
Figure 2A:
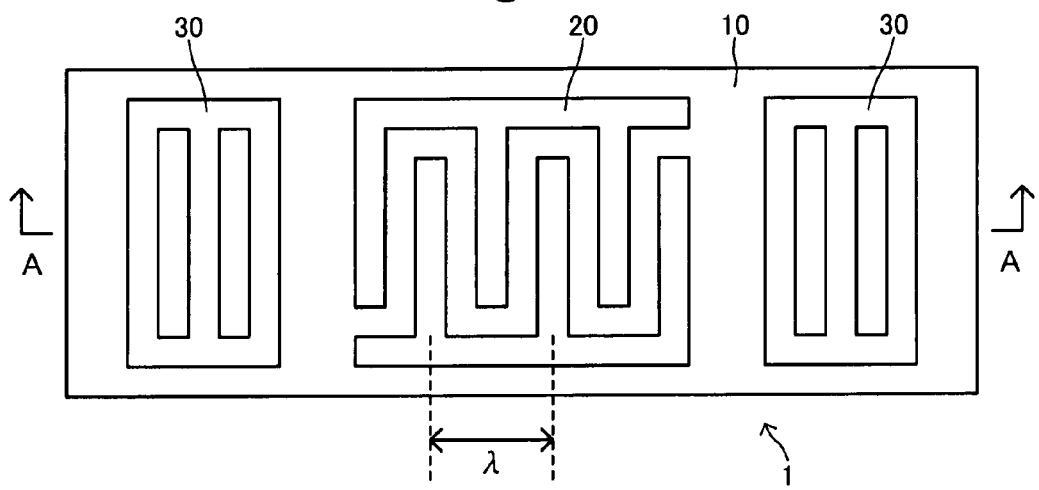
FIG. 2A is a top view schematically showing a structure of a surface acoustic wave device.
Figure 2B:
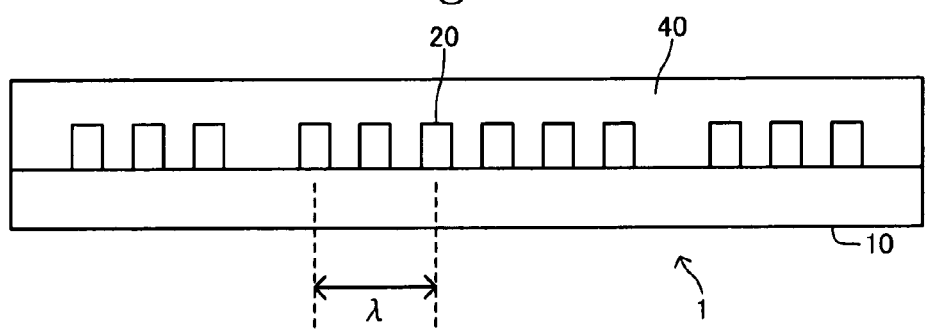
FIG. 2B is a sectional view taken along an A-A line in FIG. 2A schematically showing the structure of the surface acoustic wave device.
Figure 3:
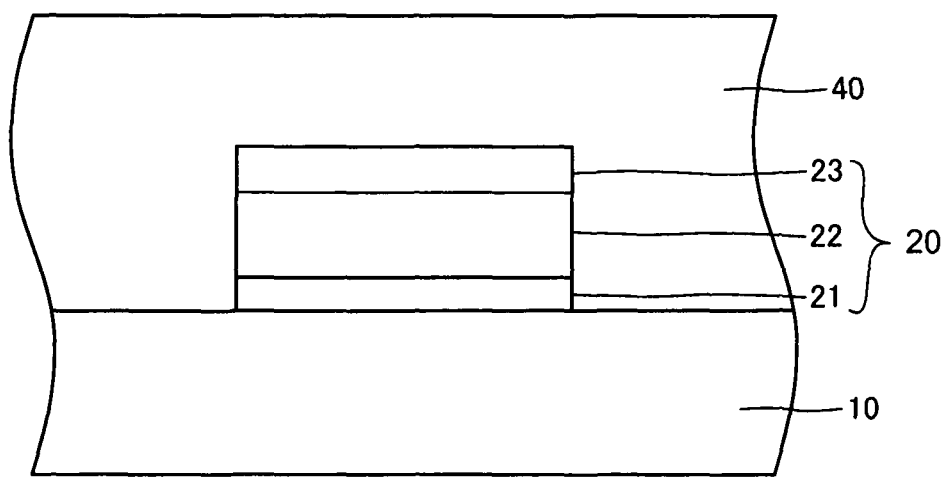
FIG. 3 is a view showing an example of a structure of a surface acoustic wave device in accordance with First exemplary embodiment of the present invention.
Figure 4:
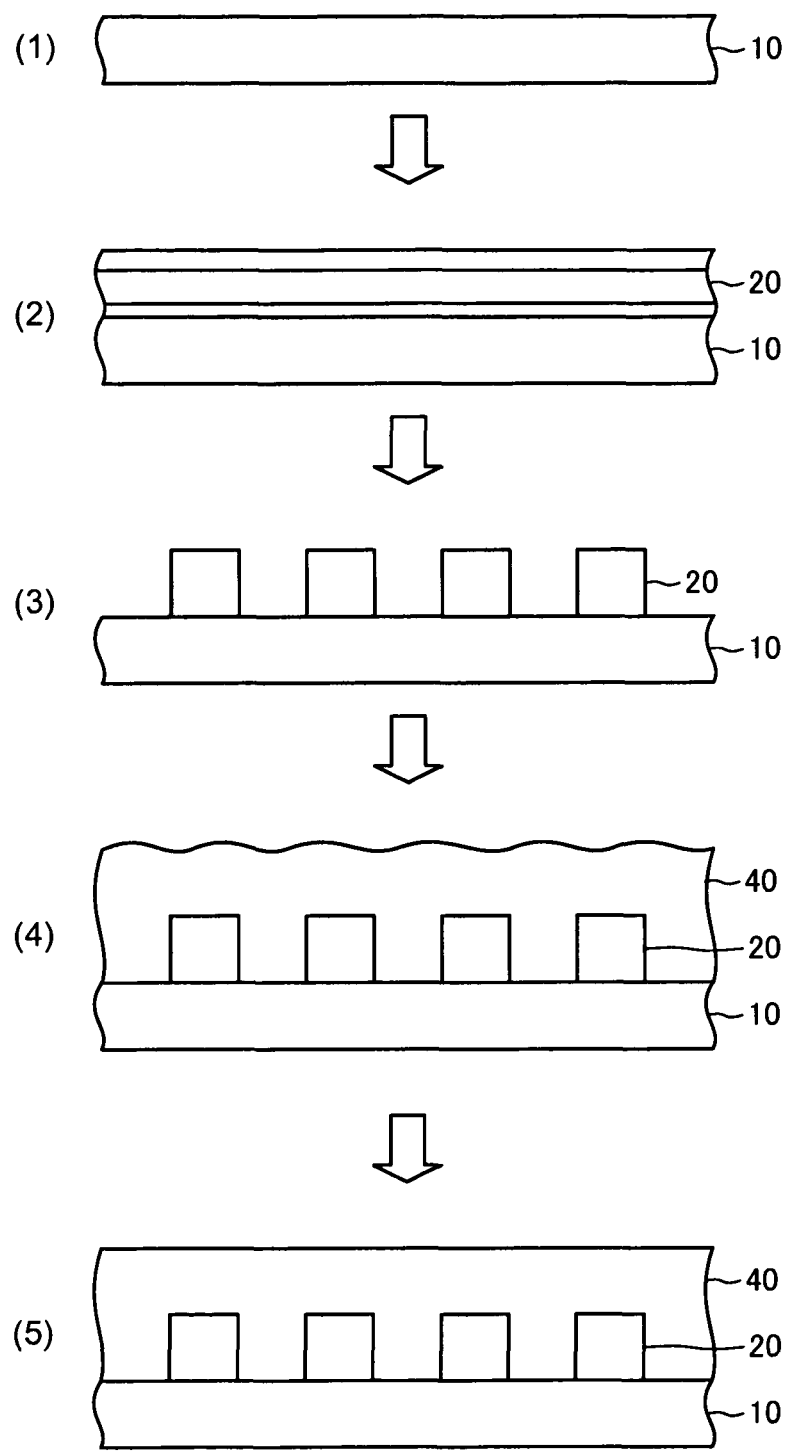
FIG. 4 is a view showing a manufacturing procedure of the surface acoustic wave device in accordance with First exemplary embodiment of the present invention.
Figure 5:
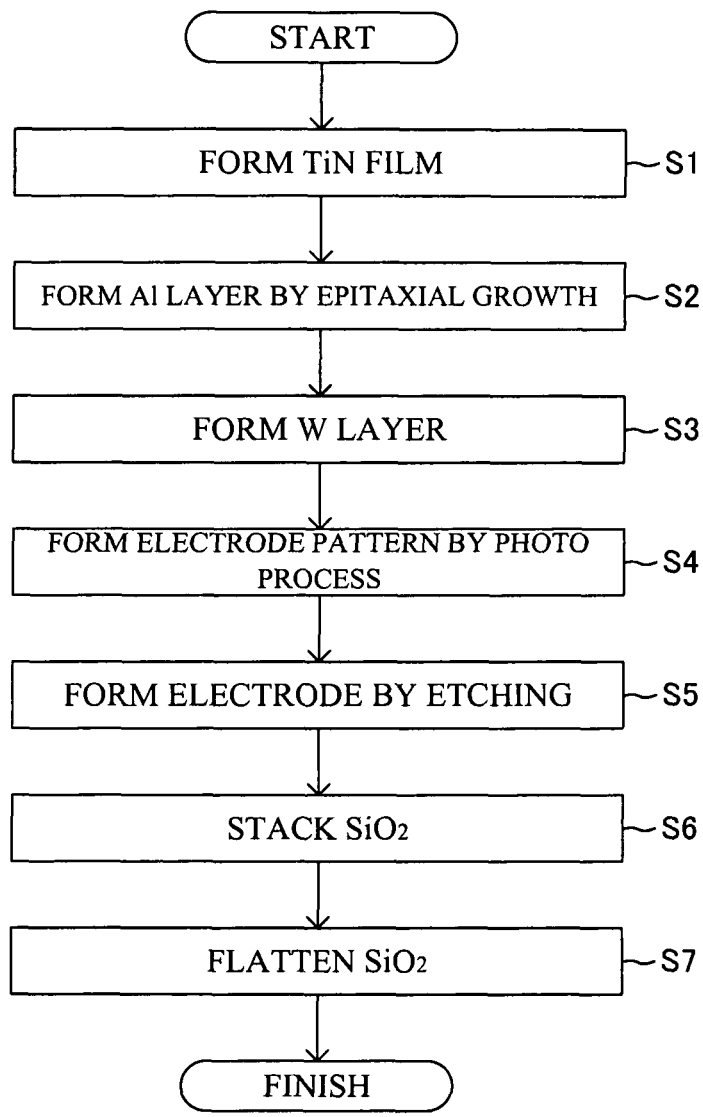
FIG. 5 is a flowchart showing a manufacturing method of the surface acoustic wave device in accordance with First exemplary embodiment of the present invention.
Figure 6:
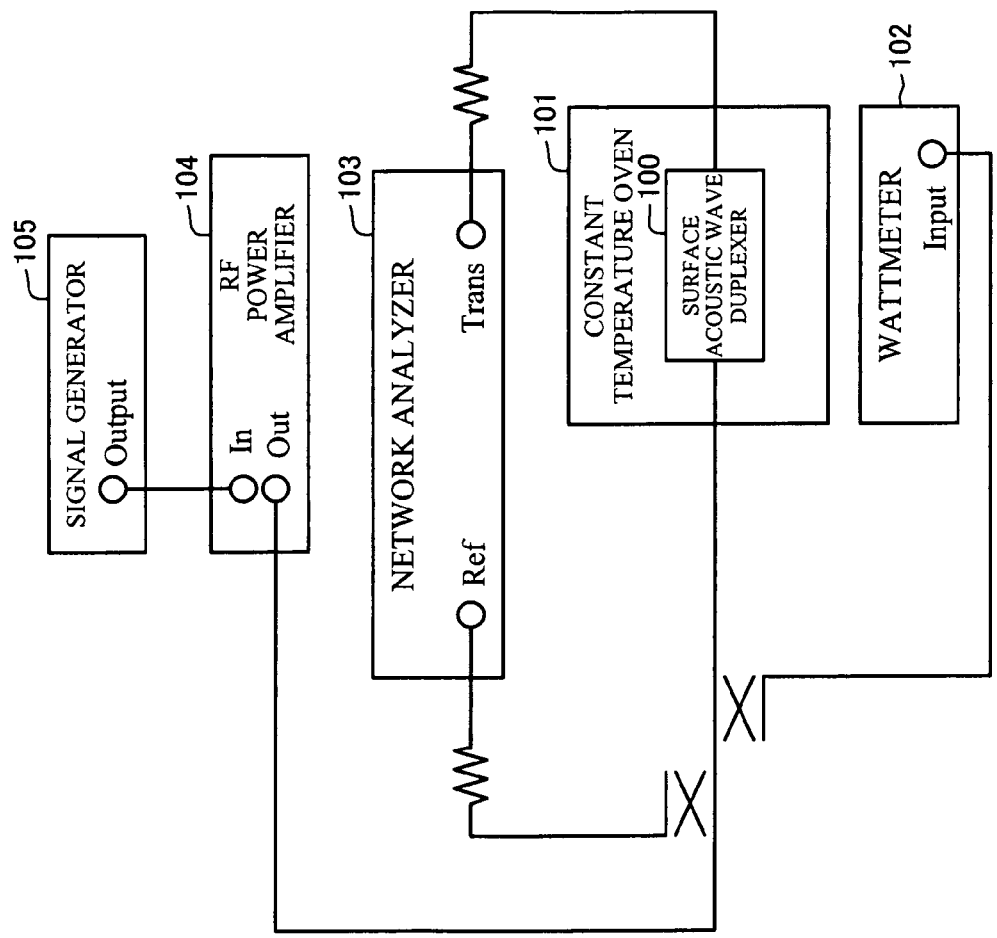
FIG. 6 is a view showing a circuit for performing characterization of the surface acoustic wave device in accordance with First exemplary embodiment of the present invention.

First exemplary embodiment of the present invention will be described with reference to FIG. 1 to FIG. 14B. FIG. 1 is a block diagram schematically showing of a structure of a portable telephone, and FIG. 2A and FIG. 2B are views showing a structure of a surface acoustic wave device. FIG. 3 is a view showing an example of a surface acoustic wave device in accordance with First exemplary embodiment, and FIG. 4 and FIG. 5 are views showing a manufacturing method of the surface acoustic wave device. FIG. 6 is a view showing a circuit for performing characterization of the surface acoustic wave device, and FIG. 7A to FIG. 14B are views showing structures and characterization results of the surface acoustic wave devices according to the present invention and surface acoustic wave devices in comparative examples.

First, referring to FIG. 1 to FIG. 5, summary of the structure and the manufacturing method of the surface acoustic wave device according to the present invention will be described. After that, in Examples 1, 2, 3, referring to FIG. 6 to FIG. 14B, specific structure and characteristics of the surface acoustic wave device according to the present invention will be described in comparison with surface acoustic wave devices with other structures.

The surface acoustic wave device according to the present invention is used as, for example, a surface acoustic wave (SAW) duplexer 1 that is equipped in the portable telephone as shown in FIG. 1 and includes a transmission-side filter part and a reception-side filter part to separates a transmission frequency band transmitted from an antenna and a reception frequency band received by an antenna, respectively. The structure of the portable telephone is known and thus the detailed description of the structure in FIG. 1 is omitted.

Part of the structure of the surface acoustic wave duplexer 1 is shown in a top view of FIG. 2A. As shown in this figure, the surface acoustic wave duplexer 1 is configured of a piezoelectric monocrystal substrate 10 and a thin-film interdigital electrode 20 (IDT: Inter Digital Transducer) having a plurality of electrode fingers on the piezoelectric monocrystal substrate 10. A reflector 30 is provided on each side of the interdigital electrode 20. FIG. 2B is a sectional view taken along an A-A line in FIG. 2A. A signal λ in FIG. 2A and FIG. 2B represents an electrode cycle of the interdigital electrode 20, that is, a wavelength of a surface acoustic wave (SAW) that propagates on the piezoelectric monocrystal substrate 10. Although not shown, the surface acoustic wave duplexer 1 further includes the transmission-side filter part and the reception-side filter part.

The surface acoustic wave device according to the present invention may be provided in either the transmission-side filter part or the reception-side filter part in the surface acoustic wave duplexer 1. Further, the surface acoustic wave device according to the present invention is not limited to be used as the surface acoustic wave duplexer 1. For example, the surface acoustic wave device may be used as a frequency filter such as a BPF (band-pass filter) shown in FIG. 1 or may be used as a resonator.

The structure of the surface acoustic wave duplexer 1 according to the present invention will be described below in detail. However, components characteristic to the present invention will be described in detail and detailed description of known components is omitted.

First, referring to FIG. 3 to FIG. 5, the structure of the surface acoustic wave duplexer 1 according to the present invention, especially, the structure of the electrode 20 and the manufacturing method of the surface acoustic wave duplexer 1 will be described. FIG. 3 is a view showing a laminated structure of the electrode 20. FIG. 4 is a view showing a manufacturing procedure of the surface acoustic wave duplexer 1 and FIG. 5 is a flowchart showing the manufacturing method.

The surface acoustic wave duplexer 1 according to the present invention, as shown in FIG. 3, includes the piezoelectric monocrystal substrate 10 and the thin-film interdigital electrode 20 formed on the piezoelectric monocrystal substrate 10. The piezoelectric monocrystal substrate 10 is, for example, a monocrystal substrate having piezoelectric properties, such as a lithium tantalate ($LiTaO_3$) or lithium niobate ($LiNbO_3$) substrate. The piezoelectric monocrystal substrate 10 described in below-mentioned Examples is cut at an cut angle of 24 to 54 degrees, that is, is cut so as to have a surface containing an X axis, which is vertical to a new Y axis obtained by rotating an initial Y axis about the X axis by 24 to 54 degrees, or is cut at an cut angle of −10 to +20 degrees, that is, to have a surface containing the X axis, which is vertical to a new Y axis obtained by rotating the initial Y axis about the X axis by −10 to +20 degrees. However, the piezoelectric monocrystal substrate 10 used in the surface acoustic wave duplexer 1 of the present invention may have any cut angle.

Then, the surface acoustic wave duplexer 1 according to the present invention includes a base electrode layer 21 formed on the piezoelectric monocrystal substrate 10, the base electrode layer 21 being made of a conductive material such as titanium nitride (TiN) and an aluminum-containing main electrode layer 22 formed on the base electrode layer 21 by epitaxial growth. The base electrode layer 21 (lower electrode layer) functions as a relief layer (buffer layer) for relieving a difference between the material for the piezoelectric monocrystal substrate 10 and the main electrode layer 22 in lattice constant. According to the present invention, an upper layer 23 made of a conductive material such as tungsten (W) or tantalum (Ta) is formed on the main electrode layer 22 formed by epitaxial growth. Then, the base electrode layer 21, the main electrode layer 22 formed by epitaxial growth and the upper layer 23 constitute the electrode 20. The surface acoustic wave duplexer 1 further includes a silicon dioxide ($SiO_2$) layer 40 that surrounds the electrode 20. However, the surface acoustic wave duplexer 1 according to the present invention does not need to have the silicon dioxide layer 40.

Next, an example of the manufacturing method of the surface acoustic wave duplexer 1 as shown in FIG. 3 will be described with reference to FIG. 4 and FIG. 5. First, the base electrode layer (reference numeral 21 in FIG. 3) such as a titanium nitride (TiN) layer is stacked on the piezoelectric monocrystal substrate 10 shown in FIG. 4(1) by use of a spattering device as shown in FIG. 4(2) (Step S1). Subsequently, aluminum (Al) is epitaxially grown on the base electrode layer by use of the spattering device to form the aluminum (Al) layer (reference numeral 22 in FIG. 3) (Step S2). Further, the upper layer such as a tungsten (W) layer (reference numeral 23 in FIG. 3) is stacked on the aluminum (Al) layer (Step S3). Thereby, as shown in FIG. 4(2), the three-layered electrode 20 is formed on the piezoelectric monocrystal substrate 10.

Subsequently, a resist of an interdigital electrode pattern is formed on a layer that becomes the electrode 20 by a photo process (photolithography process) (Step S4), and reactive ion etching (RIB) is performed so that the layer that becomes the electrode 20 takes a form of the electrode pattern (Step S5). After that, by removing remaining resist, the interdigital electrode 20 as shown in FIG. 2A can be formed (FIG. 4(3)).

Subsequently, as shown FIG. 4(4), silicon dioxide (SiO2) is stacked so as to surround the on the piezoelectric monocrystal substrate 10 and the electrode 20 by use of the spattering device (Step S6). Then, as shown in FIG. 4(5), the surface of the silicon dioxide (SiO2) layer (reference numeral 40 in FIG. 3) is flattened by RIE or ion milling (Step S7).

As described above, the three-layered thin-film electrode 20 configured of the base electrode layer 21, the aluminum layer 22 formed by epitaxial growth and the upper layer 23 can be formed on the piezoelectric monocrystal substrate 10.

The upper layer 23 formed on the epitaxially grown aluminum layer 22 should be made of a material selected from the sixth row elements as high density metals including tungsten (W), tantalum (Ta), rhenium (Re), osmium (Os), iridium (Ir), platinum (Pt) and gold (Au). However, the material for the upper layer 23 is not limited to the above-mentioned materials and is desirably a material having a larger specific gravity or a smaller electric resistance than aluminum (Al). However, the material only needs to be a conductive material that is different from the materials for the main electrode layer formed of the aluminum layer 22 and the base electrode layer formed of the titanium nitride layer 21.

The epitaxially grown aluminum layer 22 need not be made of only aluminum (Al) and may contain aluminum (Al) as a main component. In other words, the aluminum layer 22 may include metals such as Cu, Ti, Ta, Mg, Ni while using aluminum (Al) as a main component.

It is desired that the upper layer 23 is thinner than the epitaxially grown aluminum layer 22. It is especially desired that the thickness of the upper layer falls within a range of 0.25% to 0.90% of the wavelength λ of the propagated surface acoustic wave (refer to FIG. 2A and FIG. 2B). Thus, even if the upper layer 23 is formed of a tungsten layer having a higher electric resistance than the aluminum layer 22, by making the upper layer 23 thin, the electric resistance of the whole electrode 20 can be reduced.

EXAMPLES

Next, in Examples, various examples of the structure of the surface acoustic wave duplexer 1 according to the present invention and their characterization will be described. At this time, structures and characterization of surface acoustic wave duplexers to be compared with the surface acoustic wave duplexer 1 according to the present invention will be also described and compared with those of the present invention.

FIG. 6 shows a structure of a circuit for performing characterization of the surface acoustic wave duplexer 1. By using this circuit, characterization of the surface acoustic wave duplexer 1 is performed as follows.

First, a pad electrode for external connection was formed on each of a substrate of the manufactured surface acoustic wave duplexer 1 according to the present invention and a substrate of the surface acoustic wave duplexer to be compared. Then, a gold ball was brought into contact with each of these pad electrodes by ultrasonic bonding to prepare each surface acoustic wave duplexer substrate. Surface acoustic wave chips cut from the surface acoustic wave duplexer substrates by dicing were mounted on respective ceramic substrates by ultrasonic flip chip bonding to complete the surface acoustic wave duplexer according to the present invention and the surface acoustic wave duplexer to be compared.

Subsequently, to estimate power durability properties of each surface acoustic wave duplexer 100, a signal having a frequency adjusted to a frequency in a transmission-side filter pass band of the surface acoustic wave duplexer 100 was generated by a synthesizer 105 (signal generator), and the signal is amplified to electric power of 1 W by a power amplifier 104 and inputted to a transmission-side input terminal. The surface acoustic wave duplexer 100 was placed in an oven 101 (constant temperature oven) under 85° C.

In this state, power durability properties were measured for a few thousand hours by use of a network analyzer 103 and a wattmeter. Specifically, a center frequency of the surface acoustic wave duplexer 100 was measured.

Example 1

First, a manufacturing method and a structure of a surface acoustic wave duplexer in Example 1 of the present invention will be described with reference to FIG. 7A. The surface acoustic wave duplexer in Example 1 used a lithium tantalate substrate having a cut angle of 39 degrees (39 degrees LiTaO3) as the piezoelectric monocrystal substrate 10. Then, the titanium nitride (TiN) layer 21 was stacked on the piezoelectric monocrystal substrate 10 with addition of $N_2$+Ar gas using titanium (Ti) as a target by use of the spattering device. After that, aluminum (Al) was epitaxially grown on the titanium nitride layer 21 by use of the spattering device consecutively so as not to expose the piezoelectric monocrystal substrate 10 to the atmosphere to form the aluminum layer 22. The epitaxially grown aluminum layer 22 is expressed as "Ep Al" in FIG. 7A and the epitaxially grown aluminum layer 22 is hereinafter referred to as the epitaxial aluminum layer 22. Then, the tungsten (W) layer 23 was further stacked on the epitaxial aluminum layer 22 by use of the spattering device consecutively without exposure to the atmosphere.

After that, an interdigital electrode pattern was formed on a layer that became an electrode, which was formed on the whole surface of the piezoelectric monocrystal substrate 10, by the photo process, and the titanium nitride (TiN) layer 21, the epitaxial aluminum (Al) layer 22 and the tungsten (W) layer 23 were etched by RIE using $Cl_2+BCl_3$ gas to form the interdigital electrode 20.

Each layer of the surface acoustic wave duplexer in Example 1 was set so that the titanium nitride (TiN) layer 21 was 5 nm, the epitaxial aluminum (Ep Al) layer 22 was 265 nm and the tungsten (W) layer 23 was 5 nm in thickness.

Figure 8A:
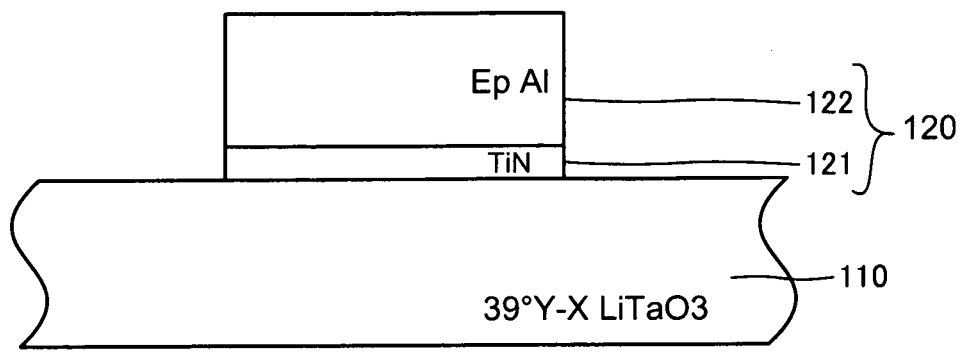
FIG. 8A is a view showing a structure of a surface acoustic wave device to be compared with the surface acoustic wave device in Example 1 of the present invention.

Meanwhile, the surface acoustic wave duplexer to be compared with the surface acoustic wave duplexer in Example 1 had a structure shown in FIG. 8A. Specifically, as in Example 1, the surface acoustic wave duplexer to be compared with the surface acoustic wave duplexer in Example 1 used a lithium tantalate 110 having a cut angle of 39 degrees (39 degrees $LiTaO_3$) as the piezoelectric monocrystal substrate. Then, a titanium nitride (TiN) layer 121 was stacked on the piezoelectric monocrystal substrate 110 with addition of $N_2+Ar$ gas using titanium (Ti) as a target by use of the spattering device. After that, aluminum (Al) was epitaxially grown on the titanium nitride layer 121 by use of the spattering device consecutively so as not to expose the piezoelectric monocrystal substrate 10 to the atmosphere to form an epitaxial aluminum (Ep Al) layer 122.

After that, an interdigital electrode pattern was formed on a layer that became an electrode, which was formed on the piezoelectric monocrystal substrate 110, by the photo process, and the titanium nitride (TiN) layer 121 and the epitaxial aluminum (Al) layer 122 were etched by RIE using $Cl_2+BCl_3$ gas to form an interdigital electrode 120. As described above, as distinct from the surface acoustic wave duplexer in Example 1, in this surface acoustic wave duplexer to be compared, the tungsten (W) layer was not formed on the epitaxial aluminum (Al) layer 122.

Each layer of this surface acoustic wave duplexer to be compared was set so that the titanium nitride (TiN) layer 121 was 5 nm and the epitaxial aluminum (Ep Al) layer 122 was 300 nm in thickness.

Figure 7A:
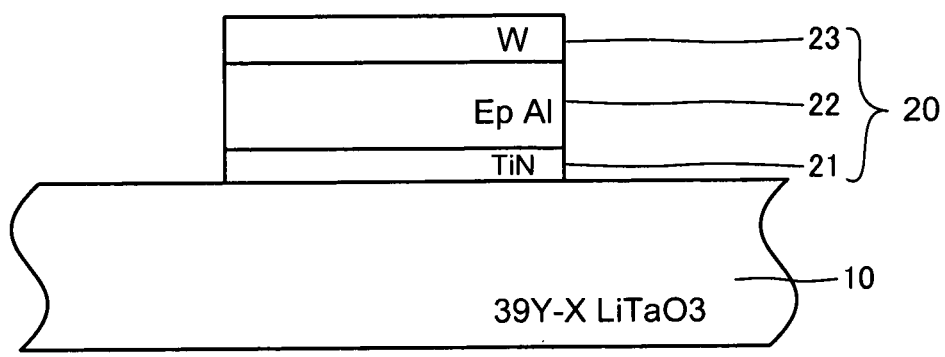
FIG. 7A is a view showing a structure of a surface acoustic wave device in Example 1 of the present invention.
Figure 7B:
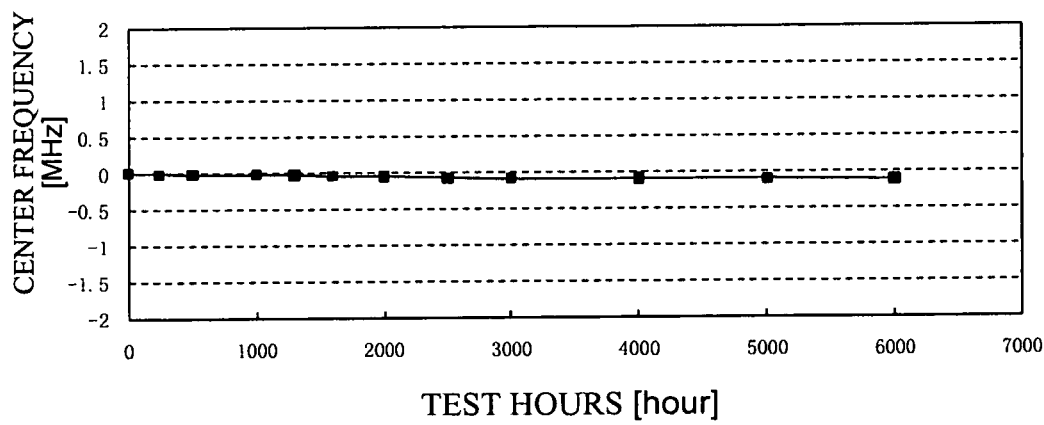
FIG. 7B is a view showing a characterization result of the surface acoustic wave device in Example 1 of the present invention.
Figure 8B:
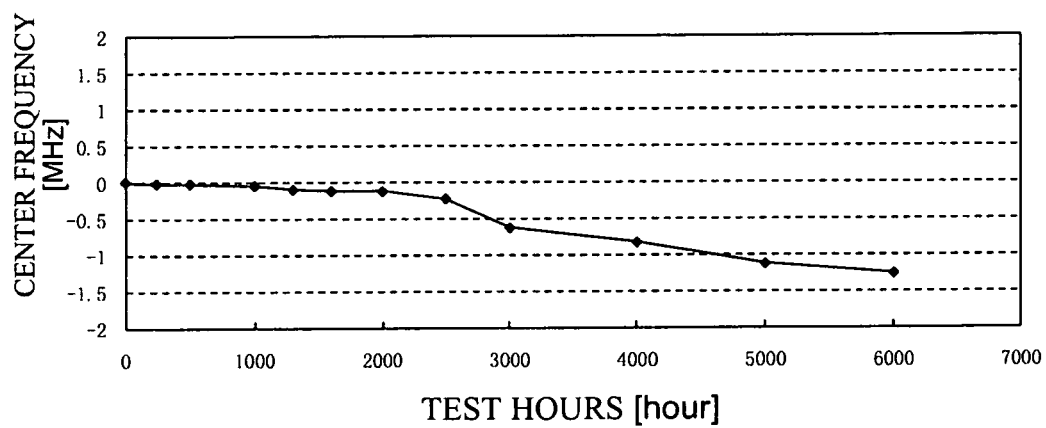
FIG. 8B is a view showing a characterization result of the surface acoustic wave device in FIG. 8A to be compared with the surface acoustic wave device in Example 1 of the present invention.

Sequentially, FIG. 7B shows a measurement result of the center frequency of the surface acoustic wave duplexer thus configured in Example 1 in FIG. 7A and FIG. 8B shows a measurement result of the center frequency of the surface acoustic wave duplexer to be compared. When comparing these results, as shown in FIG. 8B, in the surface acoustic wave duplexer to be compared, the center frequency varied by 0.5 MHz or larger after 3000 test hours, which exhibited characteristic deterioration. On the contrary, for the surface acoustic wave duplexer in Example 1, the center frequency only varied within 0.5 MHz after 6000 test hours, which did not exhibit characteristic deterioration.

Consequently, in the surface acoustic wave duplexer in Example 1, by forming the tungsten layer 23 on the epitaxial aluminum layer 22, Al atoms in the epitaxial aluminum layer 22 are prevented from moving, resulting in high power durability as demonstrated in the above-mentioned test result. Moreover, since aluminum (Al) has a smaller electric resistance that tungsten (W), by making the thickness of the tungsten layer 23 small, an insertion loss of the surface acoustic wave duplexer can be reduced, thereby suppressing deterioration of the insertion loss.

Furthermore, according to the present invention, since the surface acoustic wave device is manufactured by using the aluminum (Al) material and the tungsten (W) material, the conventional manufacturing method can be adopted and manufacturing of the electrode is not complicated. For example, both of a dry etching method and a lift-off method can be adopted, increasing a degree of flexibility in the manufacturing method.

With the above-mentioned structure, the thickness of the titanium nitride (TiN) layer 21 is preferably, 0.3 to 10 nm, more preferably, 0.8 to 7 nm.

The thickness of the epitaxial aluminum (Al) layer 22 may be appropriately determined according to the frequency band applied to the surface acoustic wave device. For example, in Example 1 and its comparative example, the thickness of each of the epitaxial aluminum (Al) layer and the tungsten (W) layer was set so that frequency characteristics of the examples became substantially equal to each other.

Example 2

Next, a manufacturing method and a structure of a surface acoustic wave duplexer in Example 2 of the present invention will be described with reference to FIG. 9A and FIG. 10A. The structure of the surface acoustic wave duplexer in Example 2 is substantially the same as that in Example 1 except for some points, and is manufactured as follows.

First, a lithium niobate having a cut angle of 0 degree (0 degree $LiNbO_3$) was used as the piezoelectric monocrystal substrate. Then, the titanium nitride (TiN) layer 21 was stacked on the piezoelectric monocrystal substrate 10 with addition of $N_2+Ar$ gas using titanium (Ti) as a target by use of the spattering device. After that, aluminum (Al) was epitaxially grown on the titanium nitride layer 21 consecutively so as not to expose the piezoelectric monocrystal substrate 10 to the atmosphere to form the epitaxial aluminum (Ep Al) layer 22. Then, the tungsten (W) layer 23 was stacked on the epitaxially grown epitaxial aluminum layer 22 by use of the spattering device consecutively without exposure to the atmosphere.

Then, as described above, an interdigital electrode pattern was formed on a layer that became an electrode, which was formed on the piezoelectric monocrystal substrate 10, by the photo process, and the titanium nitride (TiN) layer 21, the epitaxial aluminum (Ep Al) layer 22 and the tungsten (W) layer 23 were etched by RIE using $Cl_2+BCl_3$ gas to form the interdigital electrode 20.

Then, the silicon dioxide ($SiO_2$) layer 40 was formed by sputtering so as to surround the exposed surface of the piezoelectric monocrystal substrate 10 and the electrode 20. After that, the surface of the silicon dioxide layer 40 was flattened by RIE or ion milling. Further, for external connection, part of the silicon dioxide was etched by the photo process and the RIE process. The silicon dioxide ($SiO_2$) layer 40 may be flattened or need not be flattened.

Each layer of the surface acoustic wave duplexer in Example 2 was set so that the titanium nitride (TiN) layer 21 was 5 nm, the epitaxial aluminum (Ep Al) layer 22 was 90 nm, the tungsten (W) layer 23 was 15 nm and the silicon dioxide ($SiO_2$) layer 40 was 450 nm in thickness.

The thickness of the silicon dioxide ($SiO_2$) layer 40 only need to be larger than that of the electrode 20 so as to cover the upper surface of the electrode 20. In the surface acoustic wave duplexer 1, the thickness of the silicon dioxide ($SiO_2$) layer 40 is appropriately determined according to applied frequency band and required characteristics (transmission characteristics, reflectance characteristics, temperature characteristics and so on), and for example, falls within a range of 350 nm to 550 nm, desirably 17% to 33% of the wavelength λ (electrode cycle) of the surface acoustic wave (refer to FIG. 2A and FIG. 2B) as a normalized thickness.

As described above, the surface acoustic wave duplexer in Example 2 of the present invention is different from that in Example 1 in that the cut angle of the piezoelectric monocrystal substrate 10 is 0 degree and the silicon dioxide ($SiO_2$) layer is provided.

Figure 9A:
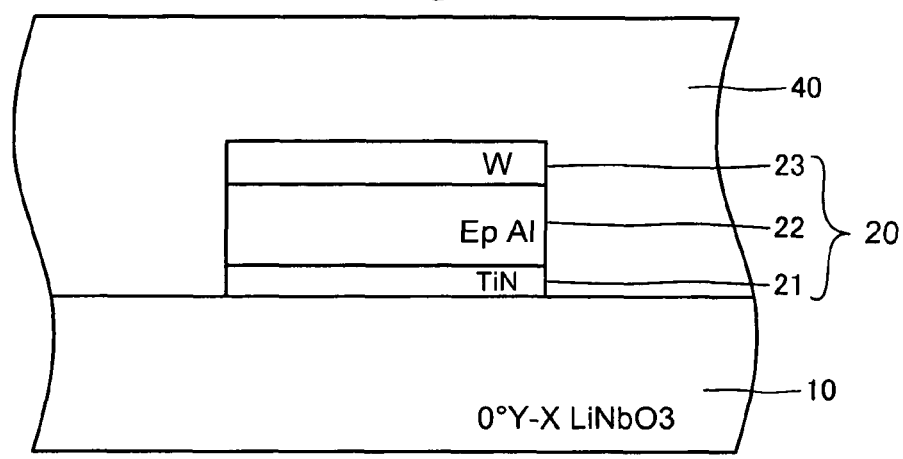
FIG. 9A is a view showing a structure of a surface acoustic wave device in Example 2 of the present invention.
Figure 10A:
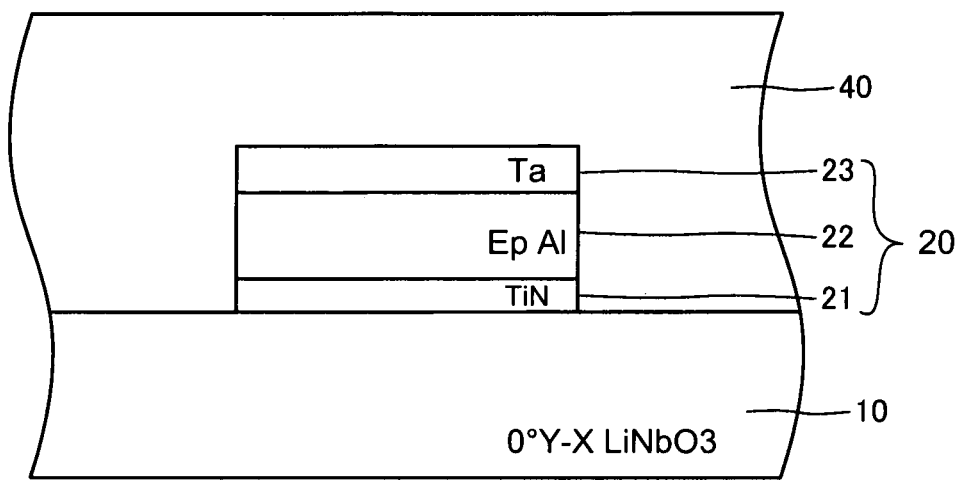
FIG. 10A is a view showing another structure of the surface acoustic wave device in Example 2 of the present invention.

FIG. 10A shows a surface acoustic wave duplexer in modification of Example 2 of the present invention. As shown in this figure, the surface acoustic wave duplexer in the modification of Example 2 is different from the surface acoustic wave duplexer in FIG. 9A in the material for the upper layer 23 formed on the epitaxial aluminum (Ep Al) layer 22 is tantalum (Ta) in place of tungsten (W). The other configuration and the manufacturing method remains the same.

Each layer of the surface acoustic wave duplexer in the modification of Example 2 was set so that the titanium nitride (TiN) layer 21 was 5 nm, the epitaxial aluminum (Ep Al) layer 22 was 105 nm, the tantalum (Ta) layer 23 was 15 nm and the silicon dioxide (SiO2) layer 40 was 450 nm in thickness.

As described above, the surface acoustic wave duplexer in the modification of Example 2 of the present invention is different from that in Example 1 in that the cut angle of the piezoelectric monocrystal substrate 10 is 0 degree, the upper layer 23 is made of tantalum (Ta) and the silicon dioxide ($SiO_2$) layer is provided.

Figure 11A:
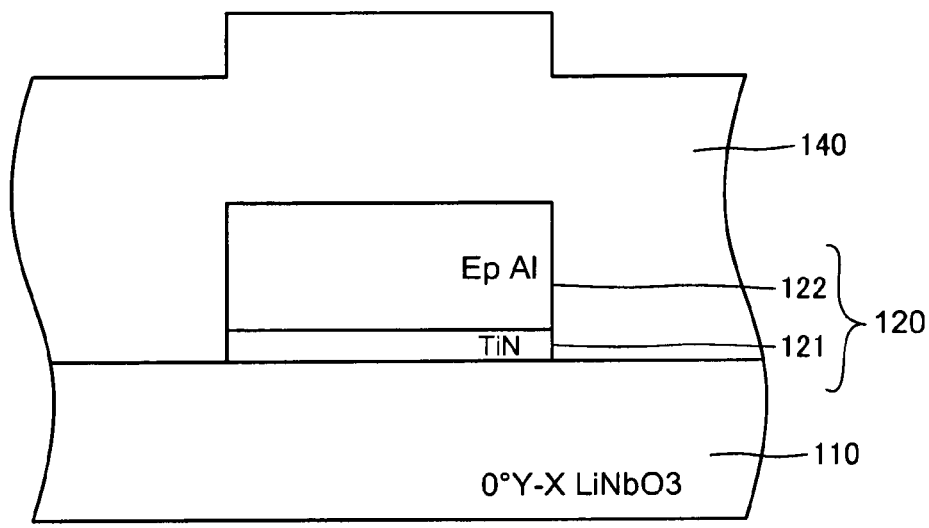
FIG. 11A is a view showing a structure of a surface acoustic wave device to be compared with the surface acoustic wave device in Example 2 of the present invention.
Figure 12A:
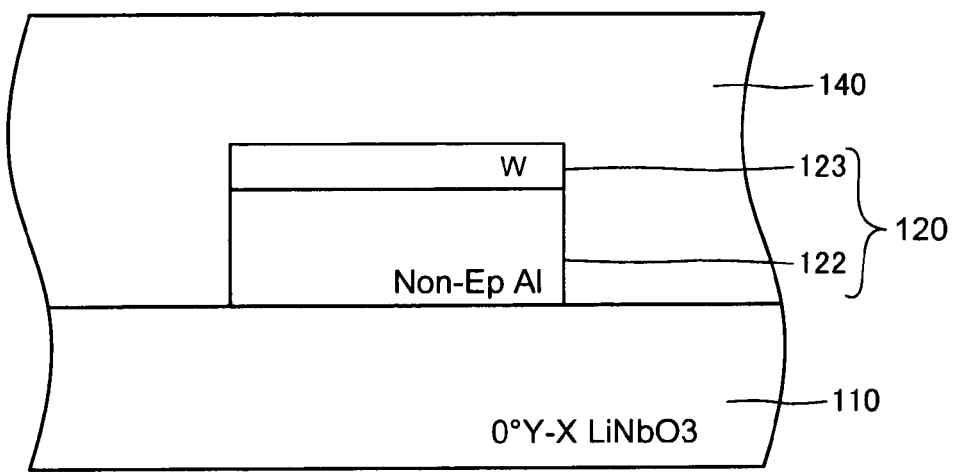
FIG. 12A is a view showing a structure of a surface acoustic wave device to be compared with the surface acoustic wave devices in Examples 1, 2 of the present invention.

Surface acoustic wave duplexers to be compared with the surface acoustic wave duplexer in Example 2 had structures shown in FIG. 11A and FIG. 12A, respectively. Specifically, as in Example 2, a first surface acoustic wave duplexer to be compared with that in Example 2 used a lithium niobate having a cut angle of 0 degree (0 degree $LiNbO_3$) 110 as the piezoelectric monocrystal substrate. The titanium nitride (TiN) layer 121 was stacked on the piezoelectric monocrystal substrate 110 with addition of $N_2$+Ar gas using titanium (Ti) as a target by use of the spattering device. After that, aluminum (Al) is epitaxially grown on the titanium nitride layer 121 by use of the spattering device consecutively so as not to expose the piezoelectric monocrystal substrate 110 to the atmosphere to form the epitaxial aluminum (Ep Al) layer 122.

Then, an interdigital electrode pattern was formed on a layer that became an electrode, which was formed of the piezoelectric monocrystal substrate 110, by the photo process, and the titanium nitride (TiN) layer 121 and the epitaxial aluminum (Al) layer 122 were etched by RIE using $Cl_2$+$BCl_3$ gas to form the interdigital electrode 120.

Then, a silicon dioxide ($SiO_2$) layer 140 was formed by sputtering so as to surround the exposed surface of the piezoelectric monocrystal substrate 110 and the electrode 120. Although the upper surface of the silicon dioxide ($SiO_2$) layer 140 is not flattened in the example in FIG. 11A, it may be flattened.

As described above, the first surface acoustic wave duplexer to be compared is different from the surface acoustic wave duplexers in Example 2 and the modification of Example 2 in that the tungsten (W) layer or the tantalum (Ta) layer is not formed.

Each layer of the first surface acoustic wave duplexer to be compared was set so that the titanium nitride (TiN) layer 121 was 5 nm, the epitaxial aluminum (Ep Al) layer 122 was 197 nm and the silicon dioxide ($SiO_2$) layer 140 was 450 nm in thickness.

A second surface acoustic wave duplexer to be compared with the surface acoustic wave duplexer in Example 2 had the structure shown in FIG. 12A. Specifically, as in Example 2, the first surface acoustic wave duplexer to be compared with that in Example 2 used the lithium niobate having a cut angle of 0 degree (0 degree $LiNbO_3$) 110 as the piezoelectric monocrystal substrate. Then, an Al—Cu alloy layer 122 was stacked on the piezoelectric monocrystal substrate 110 by use of the spattering device. Next, the tungsten (W) layer 123 was stacked by use of the spattering device consecutively without exposure to the atmosphere. The Al—Cu alloy layer 122 formed by sputtering is different from the aluminum layer formed by epitaxial growth and thus, is expressed as "Non-Ep Al" in FIG. 12A.

After that, an interdigital electrode pattern was formed on a layer that became an electrode, which was formed on one surface of the piezoelectric monocrystal substrate 110, by the photo process, and the Al—Cu alloy (Non-Ep Al) layer 122 and the tungsten (W) layer 123 were etched by RIE using $Cl_2$+$BCl_3$ gas to form the interdigital electrode 120.

The silicon dioxide ($SiO_2$) layer 140 is formed by sputtering so as to surround the exposed surface of the piezoelectric monocrystal substrate 110 and the electrode 120. Although the upper surface of the silicon dioxide ($SiO_2$) layer 140 was flattened in the example in FIG. 12A, it need not be flattened.

Each layer of the second surface acoustic wave duplexer to be compared was set so that the Al—Cu alloy layer 122 was 98 nm, the tungsten (W) layer 123 was 15 nm and the silicon dioxide ($SiO_2$) layer 140 was 450 nm in thickness.

As described above, the second surface acoustic wave duplexer to be compared is different in that despite that the tungsten (W) layer is formed, the layer that becomes the main electrode is the Al—Cu alloy layer 122 stacked by sputtering in place of the epitaxial aluminum layer.

Figure 9B:
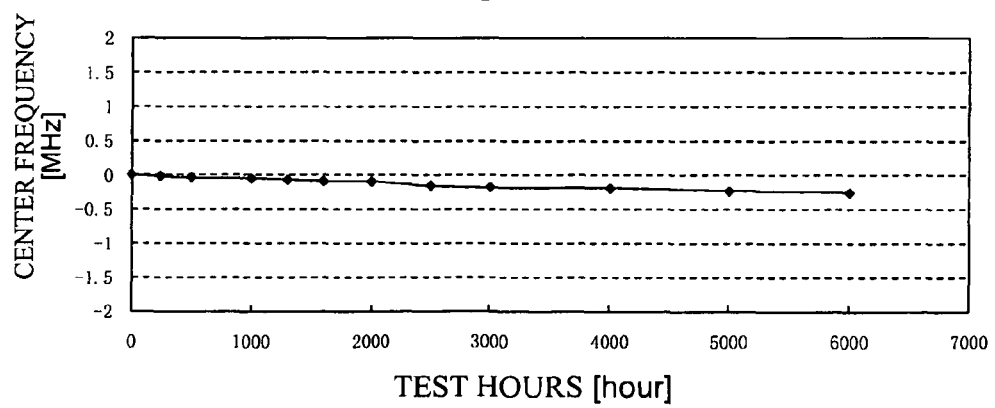
FIG. 9B is a view showing a characterization result of the surface acoustic wave device in Example 2 of the present invention.
Figure 10B:
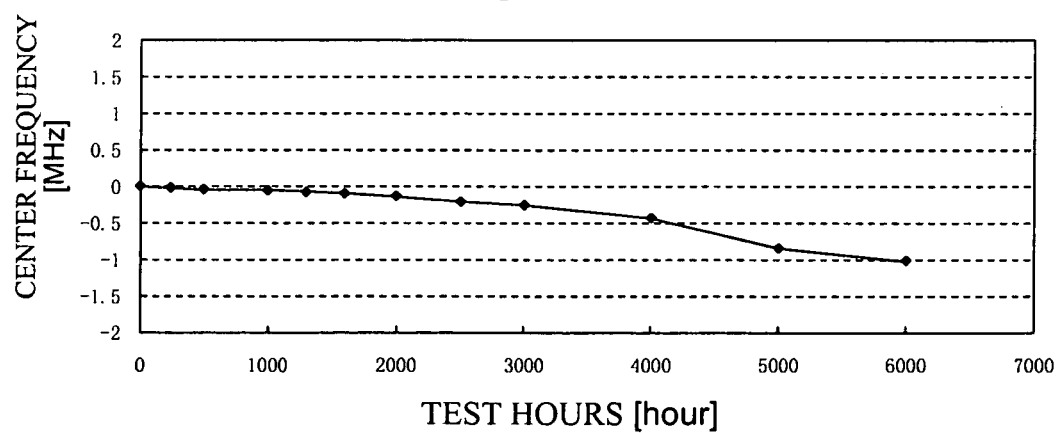
FIG. 10B is a view showing a characterization result of the surface acoustic wave device with the another configuration in Example 2 of the present invention.
Figure 11B:
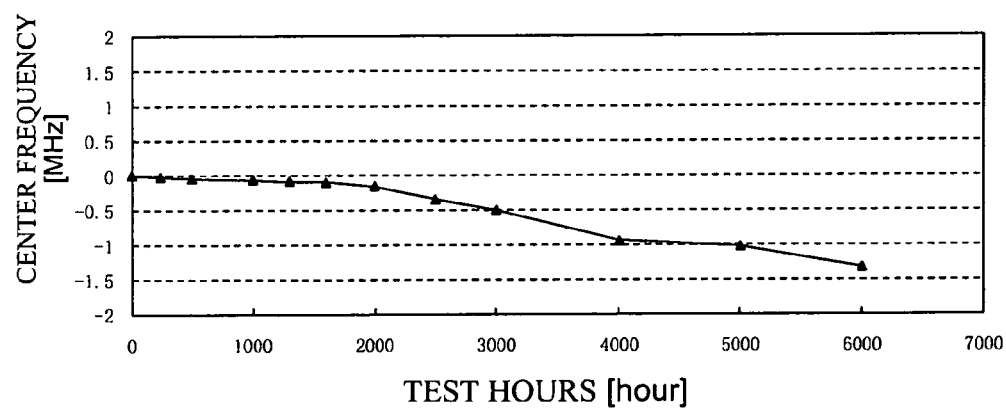
FIG. 11B is a view showing a characterization result of the surface acoustic wave device in FIG. 11A to be compared with the surface acoustic wave device in Example 2 of the present invention.
Figure 12B:
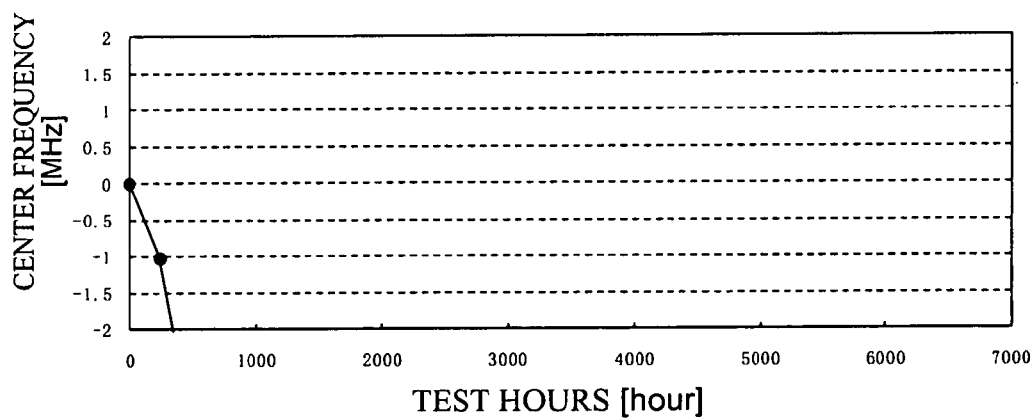
FIG. 12B is a view showing a characterization result of the surface acoustic wave device in FIG. 12A to be compared with the surface acoustic wave device in Examples 1, 2 of the present invention.

FIG. 9B shows a measurement result of the center frequency of the surface acoustic wave duplexer thus configured in Example 2 in FIG. 9A and FIG. 10B shows a measurement result of the center frequency of the surface acoustic wave duplexer in the modification of Example 2 in FIG. 10A. FIG. 11B shows a measurement result of the center frequency of the first surface acoustic wave duplexer to be compared in FIG. 11A and FIG. 12B shows a measurement result of the center frequency of the second surface acoustic wave duplexer to be compared in FIG. 12A.

As a result, in the surface acoustic wave duplexer in Example 2, as shown in FIG. 9B, the center frequency only varied within 0.5 MHz after 6000 test hours, which did not exhibit characteristic deterioration. On the contrary, in the first surface acoustic wave duplexer to be compared, as shown in FIG. 11B, the center frequency varied by 0.5 MHz or larger after 3000 test hours, which exhibited characteristic deterioration.

Even when the cut angle of the piezoelectric monocrystal substrate 10 is 0 degree, by forming the tungsten (W) layer 23 on the epitaxial aluminum (Ep Al) layer 22, power durability of the surface acoustic wave duplexer can be improved. That is, for example, as compared to a conventional about +39 degree rotated Y-cut substrate (for example, +24 to +42 degree rotated Y-cut substrate), in a −10 to +20 degree rotated Y-cut substrate, there may be a case where a rate of mismatch between the monocrystal substrate and the base electrode layer is high and the epitaxial aluminum layer contains many defects. However, even with such configuration, power durability is excellent.

Accordingly, the cut angle and the propagation direction of the piezoelectric monocrystal substrate 10 are not limited to 39 degrees and the X direction as described in Example 1, and a lithium tantalate ($LiTaO_3$) substrate having different cut angle and propagation direction, or a lithium niobate ($LiNbO_3$) substrate with similar crystal structure may be adopted. In the surface acoustic wave filter and the surface acoustic wave duplexer, the piezoelectric monocrystal substrate 10 is preferably 24 to 54 degree rotated Y $LiTaO_3$, 41±10 degree rotated Y $LiNbO_3$, 64±10 degree rotated Y $LiNbO_3$, 128±10 degree rotated Y $LiNbO_3$ or −10 to +20 degrees rotated Y $LiNbO_3$ substrate.

As described above, since power durability of the surface acoustic wave device can be improved irrespective of a value of the cut angle of the piezoelectric monocrystal substrate, the structural limitation in the surface acoustic wave device is suppressed. Therefore, the surface acoustic wave device can be manufactured with high quality at low costs.

When the electrode 20 is surrounded by the silicon dioxide ($SiO_2$) layer 40, since internal stress of the silicon dioxide ($SiO_2$) layer is applied to the electrode 20 and movement of aluminum (Al) atoms in the electrode is promoted, it is expected that power durability is further deteriorated. However, referring to the above-mentioned characterization, it is found out that power durability is improved by forming the tungsten (W) layer 23 on the epitaxial aluminum (Ep Al) layer 22 forming the electrode 20.

Further, in the surface acoustic wave duplexer in the modification in Example 2, as shown in FIG. 10B, the center frequency varied by 0.5 MHz or larger after 4000 test hours. However, characteristic deterioration was suppressed as compared to the first surface acoustic wave duplexer to be compared in FIG. 11A. Accordingly, the material for the layer formed on epitaxial aluminum (Ep Al) forming the electrode 20 is not limited to tungsten (W) and may be tantalum (Ta). As apparent from this, the material of the upper layer 23 stacked on the epitaxial aluminum (Ep Al) layer 22 may be selected from any of the sixth row elements as high density metals including tungsten (W), tantalum (Ta), rhenium (Re), osmium (Os), iridium (Ir), platinum (Pt) and gold (Au), and it is desired that the material has a larger specific gravity than aluminum or silicon dioxide ($SiO_2$) forming the epitaxial aluminum (Ep Al) layer.

In the second surface acoustic wave duplexer to be compared, the frequency varied by 0.5 MHz or larger after 50 hours. Although not shown, in the absence of the tungsten (W) layer on the Al—Cu alloy layer, a substantially similar result was obtained.

This reveals that when the upper layer 23 made of tungsten (W) or the like in the electrode 20 is formed on the aluminum-containing main electrode layer 22 epitaxially grown on the piezoelectric monocrystal substrate 10, power durability is effectively improved.

FIG. 14A shows pole figures of epitaxial aluminum in the direction of (111) plane formed on 0 degree rotated Y-X propagation $LiNbO_3$ in the left, and formed on 39 degree rotated Y-X propagation $LiTaO_3$ in the right. As shown in these figures, both in the piezoelectric monocrystal substrates, a clear spot was presented, which demonstrated that aluminum was epitaxially grown. However, for half-value width of a signal part surrounded by a circle in each plot figure of FIG. 14B, half-value width of the aluminum layer of 39 degrees $LiTaO_3$ was 0.73 degrees and half-value width of the aluminum layer on 0 degree $LiNbO_3$ was 1.82 degrees. At this time, a sharper spot existed on 39 degrees $LiTaO_3$ having a smaller half-value width, which meant epitaxial growth in one direction, that is, better crystallinity. Although the substrate having the cut angle of about 39 degrees was superior in terms of crystallinity, even when 0 degree $LiNbO_3$ that was worse than 39 degrees $LiTaO_3$ in terms of crystallinity was used in the surface acoustic wave duplexer 1, power durability could be improved as described above. Therefore, by using the piezoelectric monocrystal substrate 10 having a cut angle of about 0 degree in the surface acoustic wave duplexer, efforts of management of members in manufacturing as well as manufacturing costs can be reduced.

Example 3

Next, a manufacturing method and a structure of a surface acoustic wave duplexer in Example 3 of the present invention will be described with reference to FIG. 13A. The surface acoustic wave duplexer in Example 3 has the substantially same configuration as that in Example 2 except that a titanium (Ti) layer is provided between the titanium nitride (TiN) layer and the epitaxial aluminum layer. The manufacturing method will be described below.

First, the lithium niobate having a cut angle of 0 degree (0 degree $LiNbO_3$) was used as the piezoelectric monocrystal substrate. The titanium nitride (TiN) layer 21 was stacked on the piezoelectric monocrystal substrate 10 with addition of $N_2$+Ar gas using titanium (Ti) as a target by use of the spattering device, and a titanium (Ti) layer 21' was formed on the titanium nitride (TiN) layer 21 with addition Ar gas using titanium (Ti) as a target.

Next, aluminum (Al) was epitaxially grown on the titanium layer 21' by use of the spattering device to form the epitaxial aluminum (Ep Al) layer 22. Then, the tungsten (W) layer 23 was stacked on the epitaxially grown epitaxial aluminum layer 22 consecutively without exposure to the atmosphere by use of the spattering device.

The reason why the titanium (Ti) layer 21' as a feature of this example is formed will be described. If the titanium (Ti) layer 21' is not formed, the aluminum (Al) layer 22 is epitaxially grown on the titanium nitride layer 21 as in Examples 1, 2. At this time, a spattering device that is different from the spattering device for stacking the titanium nitride (TiN) layer 21 may be used. In this case, since the surface of the titanium nitride (TiN) layer 21 is exposed to the atmosphere once, the surface may be transformed, resulting in that the aluminum (Al) layer 22 cannot be epitaxially grown thereon. On the contrary, by forming the titanium (Ti) layer 21' on the titanium nitride (TiN) layer 21 as described above, the aluminum (Al) layer 22 can be epitaxially grown on the titanium (Ti) layer 21'.

It is preferred that the thickness of the titanium nitride (TiN) layer 21 falls within the range of 0.3 to 10 nm, especially, 0.8 to 7 nm. Further, it is more preferable as purity of the titanium (Ti) layer 21' is higher and the titanium (Ti) layer 21' of a purity of 99% or larger is most preferable.

After that, as described above, an interdigital electrode pattern was formed on a layer that became an electrode, which was formed on one surface of the piezoelectric monocrystal substrate 10, by the photo process, and the titanium nitride (TiN) layer 21, the titanium (Ti) layer 21', the epitaxial aluminum (Ep Al) layer 22 and the tungsten (W) layer 23 were etched by RIE using $Cl_2$+$BCl_3$ gas to form the interdigital electrode 20.

Then, the silicon dioxide ($SiO_2$) layer 40 was formed so as to surround the exposed surface of the piezoelectric monocrystal substrate 10 and the electrode 20 by sputtering. After that, the surface of the silicon dioxide layer 40 was flattened by RIE or ion milling. For external connection, part of the silicon dioxide layer was etched by photo process and the RIE process. The silicon dioxide ($SiO_2$) layer 40 may be flattened or need not be flattened.

Each layer of the surface acoustic wave duplexer in Example 3 was set so that the titanium nitride (TiN) layer 21 was 5 nm, the titanium (Ti) layer 21' was 5 nm, the epitaxial aluminum (Ep Al) layer 22 was 82 nm, the tungsten (W) layer 23 was 15 nm and the silicon dioxide ($SiO_2$) layer 40 was 450 nm.

As described above, the surface acoustic wave duplexer in Example 3 of the present invention is different from that in Example 2 in that the titanium (Ti) layer 21' is provided between the titanium nitride (TiN) layer 21 and the epitaxial aluminum layer 22. That is, the surface acoustic wave duplexer in Example 3 is different from that in Example 2 in that the base electrode layer between the piezoelectric monocrystal substrate 10 and the epitaxial aluminum (Ep Al) layer 22 is formed of two layers: the titanium nitride (TiN) layer 21 and the titanium (Ti) layer 21'. However, the base electrode layer is not necessarily formed of two layers.

Figure 13A:
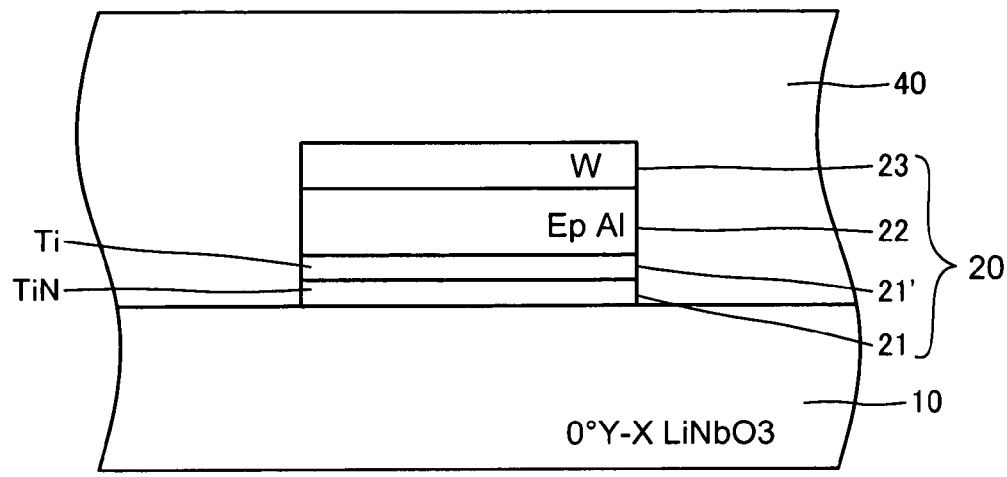
FIG. 13A is a view showing a structure of a surface acoustic wave device to be compared with the surface acoustic wave device in Example 3 of the present invention.
Figure 13B:
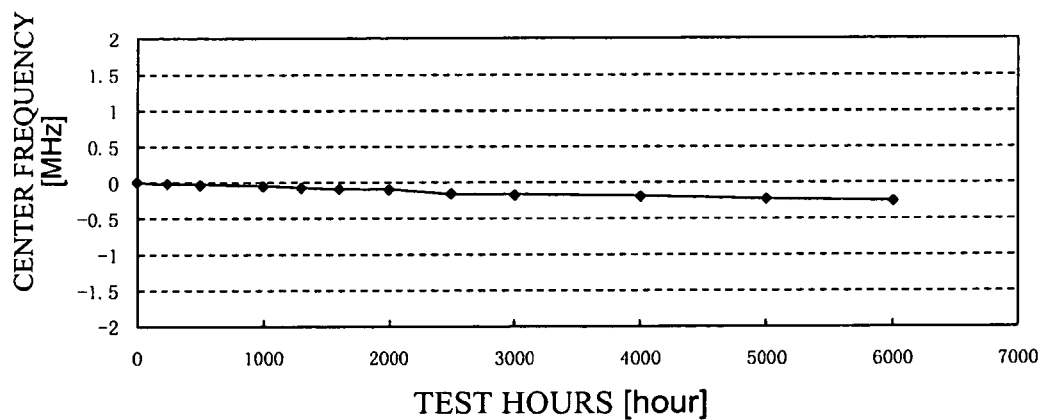
FIG. 13B is a view showing a characterization result of the surface acoustic wave device in Example 3 of the present invention.

FIG. 13B shows a measurement result of the center frequency of the surface acoustic wave duplexer in Example 3 thus configured as shown in FIG. 13A. As shown in this figure, the center frequency of the surface acoustic wave duplexer in Example 3 varies only within 0.5 MHz after 6000 hours, which does not exhibit characteristic deterioration. Therefore, even the surface acoustic wave duplexer with the above-mentioned structure can improve power durability.

Such structure, that is, the structure in which the base electrode layer between the piezoelectric monocrystal substrate 10 and the epitaxial aluminum layer 22 is formed of the titanium nitride (TiN) layer 21 and the titanium (Ti) layer 21' may be applied to the surface acoustic wave duplexer in Examples 1, 2.

<Second Exemplary Embodiment>

Next, Second exemplary embodiment of the present invention will be described. In this embodiment, summary of a structure and a manufacturing method of a surface acoustic wave device forming the surface acoustic wave duplexer described in First exemplary embodiment will be described.

The surface acoustic wave device in this embodiment includes a piezoelectric monocrystal substrate, and an interdigital electrode configured of a base electrode layer formed on the piezoelectric monocrystal substrate, the base electrode layer being made of a conductive material, and an aluminum-containing main electrode layer formed on the base electrode layer by epitaxial growth.

The interdigital electrode has an upper layer formed on the main electrode layer, the upper layer being made of a conductive material that is different from materials for the main electrode layer and the base electrode layer.

In the surface acoustic wave device, the upper layer is made of a conductive material having a larger specific gravity than aluminum.

Further, in the surface acoustic wave device, the upper layer is made of a material selected from the sixth row elements. It is especially desired that the upper layer is made of tungsten (W) or tantalum (Ta).

According to the invention, by forming the upper layer made of the conductive material that is different from the material for the main electrode layer on the main electrode layer formed by epitaxial growth to become an electrode, as shown in the power durability test results described in each of the above-mentioned Examples, power durability of the surface acoustic wave device can be further improved. At this time, since power durability of the surface acoustic wave device can be improved irrespective of a value of the cut angle of the piezoelectric monocrystal substrate, the structural limitation in the surface acoustic wave device is suppressed. Therefore, the surface acoustic wave device can be manufactured with high quality and at low costs.

By making the upper layer from the material having a low electric resistance and a large specific gravity, such as tungsten and tantalum, as shown in the power durability test results described in each of the above-mentioned Examples, power durability of the surface acoustic wave device is prominently improved.

In the surface acoustic wave device, the upper layer is thinner than the main electrode layer.

For example, it is desired that the thickness of the upper layer falls within a range of 0.25% to 0.90% of a wavelength of a propagating surface acoustic wave.

According to the invention, even when electric resistance of the material for the upper layer is higher than that of the material for the main electrode layer, by forming the upper layer so as to thinner than the main electrode layer, electric resistance of the whole electrode can be reduced, thereby preventing performances of the surface acoustic wave device from lowering.

In the surface acoustic wave device, the base electrode layer includes a titanium nitride layer formed on the piezoelectric monocrystal substrate and a titanium layer formed on the titanium nitride layer, and the main electrode layer is formed on the titanium layer by epitaxial growth.

According to the above-mentioned invention, in forming the main electrode layer on the base electrode layer by epitaxial growth, the surface of the base electrode layer may be exposed to the atmosphere due to device exchange for forming the main electrode layer or the like. However, even in this case, by forming the titanium layer on the titanium nitride layer, a good main electrode layer can be epitaxially grown on the titanium layer. As a result, a high-quality surface acoustic wave device can be manufactured.

In the surface acoustic wave device, the interdigital electrode is surrounded by silicon dioxide.

Even with the above-mentioned structure according to the present invention, as shown in the power durability test results described in each of the above-mentioned Examples, power durability of the surface acoustic wave device can be improved.

The above-mentioned surface acoustic wave device can be manufactured according to a below-mentioned manufacturing method.

That is, the manufacturing method of the surface acoustic wave device in this embodiment includes forming a base electrode layer made of a conductive material on a piezoelectric monocrystal substrate, forming an aluminum-containing main electrode layer on the base electrode layer by epitaxial growth, forming an upper layer on the main electrode layer, the upper layer being made of a conductive material that is different from materials for the main electrode layer and the base electrode layer and forming an interdigital electrode configured of the base electrode layer, the main electrode layer and the upper layer on the piezoelectric monocrystal substrate.

This application is based upon and claims the benefit of priority from Japanese patent application No. 2010-076633, filed on Mar. 30, 2010, the disclosure of which is incorporated herein in its entirety by reference.

The surface acoustic wave device according to the present invention can be used as the surface acoustic wave duplexer and the surface acoustic wave filter that are equipped in the portable telephone and has industrial availability.

The invention claimed is:

1. A surface acoustic wave device comprising:
   a piezoelectric monocrystal substrate having any cut angle, and
   an interdigital electrode configured of a base electrode layer formed on the piezoelectric monocrystal substrate, the base electrode layer being made of a conductive material, and an aluminum-containing main electrode layer formed on the base electrode layer by epitaxial growth, wherein:

the interdigital electrode has an upper layer formed on the main electrode layer, the upper layer being made of a conductive material that is different from materials for the main electrode layer and the base electrode layer and has a larger specific gravity than aluminum, the interdigital electrode is composed of a three-layer structure being configured with the base electrode layer, the main electrode layer, and the upper layer, the base electrode layer comprises a titanium nitride layer formed on the piezoelectric monocrystal substrate and a titanium layer formed further on the said titanium nitride layer, on which the main electrode layer is formed by epitaxial growth, the upper layer, which is the top layer of the interdigital electrode and located on the main electrode layer, is made of tungsten or tantalum, and the interdigital electrode is surrounded by silicon dioxide.

2. The surface acoustic wave device according to claim 1, wherein the upper layer is thinner than the main electrode layer.

3. The surface acoustic wave device according to claim 1, wherein the thickness of the upper layer falls within a range of 0.25% to 0.90% of a wavelength of a propagating surface acoustic wave.

4. A duplexer equipped with a surface acoustic wave device, wherein the surface acoustic wave device includes:

a piezoelectric monocrystal substrate having any cut angle, and an interdigital electrode configured of a base electrode layer formed of the piezoelectric monocrystal substrate, the base electrode layer being made of a conductive material, and an aluminum-containing main electrode layer formed on the base electrode layer by epitaxial growth, wherein:

the interdigital electrode has an upper layer formed on the main electrode layer, the upper layer being made of a conductive material that is different from materials for the main electrode layer and the base electrode layer and has a larger specific gravity than aluminum, the interdigital electrode is composed of a three-layer structure being configured with the base electrode layer, the main electrode layer, and the upper layer, the base electrode layer comprises a titanium nitride layer formed on the piezoelectric monocrystal substrate and a titanium layer formed further on the said titanium nitride layer, on which the main electrode layer is formed by epitaxial growth, the upper layer, which is the top layer of the interdigital electrode and located on the main electrode layer, is made of tungsten or tantalum, and the interdigital electrode is surrounded by silicon dioxide.

5. A manufacturing method of a surface acoustic wave device, the method comprising:

forming a base electrode layer made of a conductive material on a piezoelectric monocrystal substrate having any cut angle, forming an aluminum-containing main electrode layer on the base electrode layer by epitaxial growth, forming an upper layer on the main electrode layer, the upper layer being made of a conductive material that is different from materials for the main electrode layer and the base electrode layer and forming an interdigital electrode configured of the base electrode layer, the main electrode layer and the upper layer on the piezoelectric monocrystal substrate, wherein:

the interdigital electrode is composed of a three-layer structure being configured with the base electrode layer, the main electrode layer, and the upper layer, the base electrode layer comprises a titanium nitride layer med on the piezoelectric monocrystal substrate and a titanium layer formed further on the said titanium nitride layer, on which the main electrode layer is formed by epitaxial growth, the upper layer, which is the top layer of the interdigital electrode and located on the main electrode layer, is made of tungsten or tantalum, and the interdigital electrode is surrounded by silicon dioxide.

6. The surface acoustic wave device according to claim 1, wherein the interdigital electrode consists of the three-layer structure.

7. The duplexer according to claim 4, wherein the interdigital electrode consists of the three-layer structure.

8. The manufacturing method according to claim 5, wherein the interdigital electrode consists of the three-layer structure.

9. The surface acoustic wave device according to claim 1, wherein the upper layer is the outermost layer of the interdigital electrode.

10. The duplexer according to claim 4, wherein the upper layer is the outermost layer of the interdigital electrode.

11. The manufacturing method according to claim 5, wherein the upper layer is the outermost layer of the interdigital electrode.

* * * * *